US008107911B2

(12) United States Patent
Dvorszky et al.

(10) Patent No.: US 8,107,911 B2
(45) Date of Patent: Jan. 31, 2012

(54) SIGNAL PROCESSING DEVICE AND SIGNAL PROCESSING METHOD

(75) Inventors: Robert Dvorszky, Heilbronn (DE);
Ulrich Grosskinsky, Neudenau (DE);
Lourans Samid, Heilbronn (DE);
Marco Schwarzmueller, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 835 days.

(21) Appl. No.: 12/125,087

(22) Filed: May 22, 2008

(65) Prior Publication Data

US 2008/0293369 A1 Nov. 27, 2008

Related U.S. Application Data

(60) Provisional application No. 60/940,385, filed on May 25, 2007.

(30) Foreign Application Priority Data

May 22, 2007 (DE) .......................... 10 2007 024 013

(51) Int. Cl.
H04B 1/06 (2006.01)
H04B 1/00 (2006.01)
(52) U.S. Cl. .................. 455/232.1; 455/234.1; 455/296; 455/306; 455/311
(58) Field of Classification Search ............... 455/232.1, 455/234.1, 234.2, 241.1, 245.1, 239.1, 250.1, 455/296, 303, 306, 307, 309, 312
See application file for complete search history.

(56) References Cited

U.S. PATENT DOCUMENTS

| 4,691,722 | A  |   | 9/1987  | Silvernail et al.             |
|-----------|----|---|---------|-------------------------------|
| 5,812,025 | A  | * | 9/1998  | Shimazaki ............... 330/129 |
| 6,240,100 | B1 | * | 5/2001  | Riordan et al. ............. 370/442 |
| 6,654,593 | B1 | * | 11/2003 | Simmons et al. ........ 455/234.1 |
| 7,139,542 | B2 | * | 11/2006 | Vepsalainen et al. ...... 455/266 |
| 7,295,813 | B2 | * | 11/2007 | Haub et al. ............ 455/67.13 |
| 7,299,021 | B2 | * | 11/2007 | Rssinen et al. ......... 455/226.1 |
| 7,499,692 | B2 | * | 3/2009  | Nakamura et al. ........ 455/296 |
| 7,894,786 | B2 | * | 2/2011  | Hwang ................... 455/245.1 |
| 2003/0142767 | A1 | * | 7/2003 | Ichihara ................. 375/344 |
| 2004/0087279 | A1 | * | 5/2004 | Muschallik et al. ........ 455/73 |
| 2004/0097212 | A1 | * | 5/2004 | Matsumoto et al. ........ 455/296 |
| 2005/0276909 | A1 |   | 12/2005 | Benson et al.                |
| 2006/0014508 | A1 |   | 1/2006  | Seneschal et al.             |

FOREIGN PATENT DOCUMENTS

| DE | 3527515 A1   | 2/1986  |
| EP | 0 005 632 A2 | 11/1979 |
| EP | 0 510 546 A1 | 10/1992 |
| WO | WO 98/50947  | 11/1998 |

* cited by examiner

Primary Examiner — Duc M Nguyen
(74) Attorney, Agent, or Firm — Baker Botts L.L.P.

(57) ABSTRACT

A signal processing device and signal processing method is provided that includes a detection unit for detecting a signal strength of a signal, whereby the detection unit is configured to output a detection value that represents the signal strength of the signal; a settable digital filter connected upstream of the detection unit, whereby filter coefficients for setting a transfer characteristic of the filter are assigned to an amplification or attenuation of the signal by the filter; a digital multiplication unit, which is connected upstream of the detection unit for amplification or attenuation of the signal, whereby the multiplication unit is configured to compensate partially for the amplification or attenuation of the filter, whereby the compensation is encumbered with a residual error; and a correction unit to apply to the detection value a correction value at least partially compensating for the residual error.

20 Claims, 2 Drawing Sheets

SIGNAL PROCESSING DEVICE AND SIGNAL PROCESSING METHOD

This nonprovisional application claims priority to German Patent Application No. DE 10 2007 024 013.0, which was filed in Germany on May 22, 2007, and to U.S. Provisional Application No. 60/940,385, which was filed on May 25, 2007, and which are both herein incorporated by reference.

BACKGROUND OF THE INVENTION

1. Field of the Invention

The present invention relates to a signal processing device and a signal processing method.

2. Description of the Background Art

U.S. Patent No. 2006/0014508 A1 discloses a circuit for detecting the power of an input signal of a receiving system. The receiving system has a number of analog amplifiers with automatic gain control, an analog selective filter with a fixed filter characteristic, an analog mixer, and measuring means for measuring the power of an output signal for a predefined frequency. Furthermore, calculation means for detecting the power of the input signal, the gain of the number of analog amplifiers, and the gain of the analog selective filter for the predefined frequency based on a calibration of parameters of filter functions for different frequency ranges are provided.

SUMMARY OF THE INVENTION

It is an object of the invention to simplify as much as possible a digital signal processing device or signal processing method.

The invention is based on the realization that a change in a transfer characteristic of a signal processing element, particularly a filter, can be compensated at least partially by correcting a detection value obtained based on the output signal of the signal processing element, which represents a characteristic output variable, such as, e.g., power.

By correcting the (generally scalar) detection value, a scalar quantity is processed and not, for example, the entire output signal of the signal processing element. Predefined correction values can be assigned to each predefined transfer characteristic in the front end and stored, e.g., in a lookup table.

According to one aspect, the invention provides a signal processing device having a signal processing element with, for example, settable filter coefficients for a settable transfer characteristic, e.g., a predefined transfer function or a predefined impulse response or a predefined attenuation characteristic or a predefined amplification.

Further, the signal processing device has an application unit, which is connected downstream of the filter to amplify or attenuate a filter output signal. The application unit is configured to compensate partially for an effect of the predefined transfer characteristic of the filter on a characteristic quantity of an input signal, whereby the compensation is burdened with a residual error.

Further, the signal processing device comprises a detection unit for detecting a characteristic quantity of an output signal of the signal processing element, whereby the detection unit is configured to output a detection value that represents the characteristic quantity of the output signal.

Further, the signal processing device has a correction unit for applying a predefined correction value to the detection value for the at least partial compensation of the residual error. The correction value is assigned to the predefined transfer characteristic.

Further, the signal processing device comprises a control unit for setting the predefined filter coefficients of the filter, the predefined amplification or attenuation of the application unit, and the predefined correction value of the correction unit.

According to an embodiment, the characteristic quantity of the output signal represents a characteristic quantity of an input signal of the signal processing element. The correction unit is configured further to apply the predefined correction value to the detection value, e.g., by addition or multiplication, to compensate at least partially for the effect of the predefined transfer characteristic on the characteristic quantity of the input signal of the signal processing element.

According to another embodiment, the characteristic quantity of the input or output signal is the power or the energy or the amplitude or the phase.

According to another embodiment, the detection unit is configured to measure the characteristic quantity of the output signal. For example, the detection unit performs an RSSI measurement to determine the power of the output signal.

According to another embodiment, the control unit is configured to select the predefined transfer characteristic from a plurality of transfer characteristics, whereby each transfer characteristic of the plurality of transfer characteristics is assigned a correction value. The transfer characteristics, which are determined, e.g., by filter coefficients or coefficients of an impulse response, can be provided, e.g., in the form of coefficients in a memory and retrieved from the same.

According to another embodiment, the control unit is configured to provide the correction unit with the predefined correction value, which can be stored, for example, in a lookup table.

According to another embodiment, the signal processing unit comprises further an application unit, which is connected downstream of the signal processing element and receives its output signal. The application unit is preferably configured to apply a predefined application value, which is assigned to the predefined transfer characteristic or the predefined correction value to the output signal, for example, by addition or multiplication, at least to reduce, e.g., the effect of the change in the transfer characteristic of the signal processing element on the characteristic quantity of the output signal.

According to another embodiment, the control unit is configured to select the predefined transfer characteristic from a plurality of transfer characteristics, whereby each transfer characteristic of the plurality of transfer characteristics is assigned an application value. The application values can be provided, e.g., in a lookup table.

According to another embodiment, the control unit is configured to provide the predefined application value to the application unit.

According to another embodiment, the characteristic quantity of the output signal represents a characteristic quantity of an input signal of the signal processing element, e.g., power. The application unit is preferably configured to apply a predefined application value to the output signal, to compensate at least partially for the effect of the predefined transfer characteristic on the characteristic quantity of the input signal. The correction unit is configured further to compensate at least partially for an effect, remaining after the at least partial compensation, of the predefined transfer function on the detection value by applying the predefined correction value to the same. The use of this two-step concept achieves that the correction values for correcting the detection value are low. The application value is thereby preferably a power of two, e.g., $2^N$ or $2^{(-N)}$, where N is, e.g., a natural number.

According to another embodiment, the signal processing element is a filter, e.g., a bandpass filter, with settable filter coefficients. The control unit preferably changes the filter coefficients of the filter to set the predefined transfer characteristic by setting the predefined filter coefficients.

According to another embodiment, the signal processing unit comprises another signal processing element with a settable transfer characteristic, which is connected upstream of the signal processing element. Another application unit can be provided further between the other signal processing element and the signal processing element. In this case, the control unit is configured to set another predefined transfer characteristic of the additional signal processing element. The correction unit is preferably configured to apply to the detection value a total correction value, which represents a superimposition of the predefined correction value, assigned to the predefined transfer characteristic, and another predefined factor, assigned to the additional predefined transfer characteristic. For this purpose, the correction unit may have one, two, or more adders, which add the correction value and the detection value.

According to another aspect, the invention provides a signal processing device with a detection unit, a settable digital filter as the signal processing element, a digital multiplication unit as the application unit, and a correction unit.

The detection unit is configured to detect a signal strength of a signal. In this case, a detection value output by the detection unit represents the signal strength of the signal. This type of signal strength can be depicted, for example, by an RSSI value.

The settable digital filter is connected upstream of the detection unit in the signal path and influences the signal according to its transfer characteristic. Filter coefficients for setting the transfer characteristic of the filter are assigned to an amplification or attenuation of the signal by the filter. The amplification or attenuation of the signal is predefined by the filter coefficients in this case.

The digital multiplication unit is connected upstream of the detection unit for amplification or attenuation of the signal. The multiplication unit is configured to compensate only partially for the amplification or attenuation of the filter. In this case, the compensation is encumbered with a residual error. The signal is amplified or attenuated by the multiplication device preferably by the factor $1/(2^{\wedge})$, where N may be a positive or negative whole number. The residual error in this case is determined by the difference between the amplification or attenuation by the filter and the approximate amplification according to the factor $1/(2^{\wedge}N)$ of the multiplication device.

The correction unit is configured to apply to the detection value a correction value at least partially compensating for the residual error. Preferably, the correction unit is configured for applying a logarithmic correction value for the addition of a logarithmic detection value.

According to an aspect, it is provided that the attenuation or amplification of the multiplication unit and the correction value of the correction unit are predefined and assigned to the predefined transfer characteristic of the filter. Preferably, values for the attenuation or amplification and the correction values are stored in a table and assigned to the predefined transfer characteristic, for example, by a pointer.

The attenuation or amplification of the multiplication unit and the correction value of the correction unit and the transfer characteristic of the filter preferably can be controlled together by precisely one signal.

Advantageously, the multiplication unit for multiplying the signal by a factor is configured as a shift register or as a multiplexer or a gate logic.

In an embodiment, the filter is configured as a bandpass filter, whereby a bandwidth can be set as a transfer characteristic of the bandpass filter by the filter coefficients.

According to another aspect, the invention provides a signal processing method with the step of processing a signal by means of a signal processing element, which has a transfer characteristic, to obtain an output signal, the step of setting a predefined transfer characteristic of the signal processing element, the step of detecting a characteristic quantity of an output signal of the signal processing element, the step of outputting a detection value, which represents the characteristic quantity of the output signal, and the step of applying a predefined correction value, assigned to the predefined transfer characteristic, to the detection value.

According to another embodiment, the signal processing step comprises the step of applying a predefined application value, assigned to the predefined transfer characteristic or to the predefined correction value, to the output signal of the signal processing element.

According to another embodiment, the characteristic quantity of the output signal represents a characteristic quantity of an input signal of the signal processing element. The predefined application value is preferably applied to the output signal to compensate at least partially for the effect of the predefined transfer characteristic on the characteristic quantity of the input signal of the signal processing element. The predefined correction value is preferably applied to the detection value to compensate at least partially for an effect, remaining after the least partial compensation, of the predefined transfer function on the detection value.

Other steps of the method according to the invention result directly from the functionality of the signal processing unit.

According to another aspect, the invention provides a computer program for carrying out the method according to the invention, when the computer program runs on a computer.

According to another aspect, the invention provides a data processing unit, which is set up by programming and is configured to allow the computer program to run to execute the steps of the method of the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
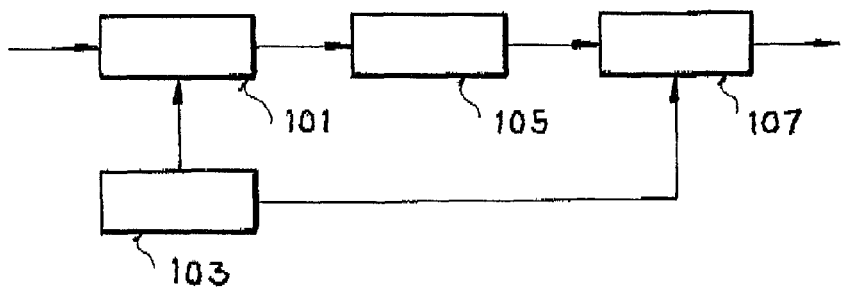
FIG. 1 illustrates a block diagram of a signal processing device.

FIG. 1 shows a block diagram of a signal processing device with a digital signal processing module 101, which has at least one digital signal processing element. The signal processing device has a digital control unit 103 for setting a predefined transfer characteristic of the signal processing element by, e.g., exchanging the coefficients that define the transfer characteristic. Further, the signal processing device has a digital detection unit 105 for detecting a characteristic quantity of an output signal of the signal processing element 101 and a correction unit 107 for applying a predefined correction value to a detection value provided by detection unit 105, whereby the correction value is assigned to the predefined transfer characteristic.

Figure 2:
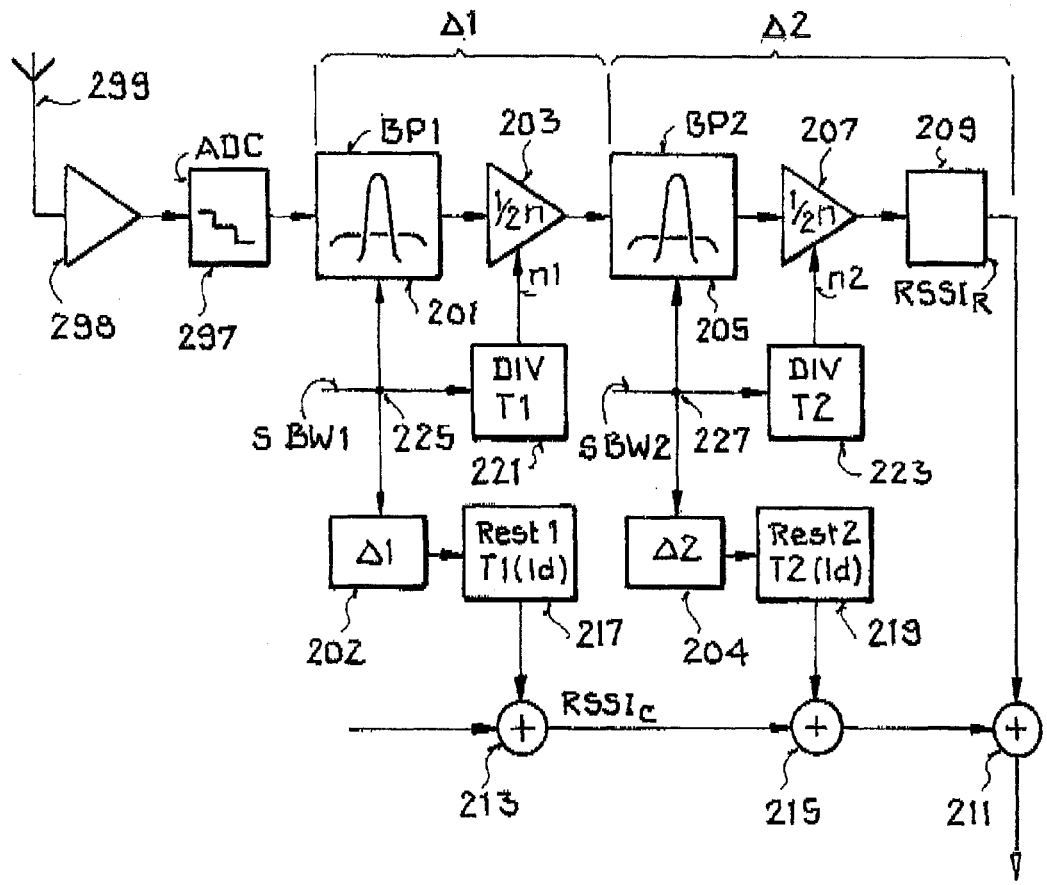
FIG. 2 illustrates a block diagram of a signal processing device.

FIG. 2 shows a block diagram of a signal processing device with a first signal processing element 201, whose output is coupled via a first application unit 203 to an input of a second signal processing element 205. An output of second signal processing element 205 is coupled via a second application unit 207 to a detection unit 209. An output of detection unit 209 is coupled to an input of an adder 211 of a correction unit.

The signal processing device comprises further another (optional) adder 213, which is assigned to first signal processing element 201, and another adder 215, which is assigned to second signal processing element 205. Optional adder 213 comprises an optional input for receiving additional correction values, which can be assigned to additional signal processing elements (not shown). Another input of optional adder 213 is connected to an output of a first memory element 217, whereby an output of optional adder 213 is connected to an input of additional adder 215. Another input of additional adder 215 is connected to an output of a second memory element 219. An output of additional adder 215 is coupled to another input of correction unit 211.

The signal processing device comprises further a third memory element 221, which is coupled to a control input of first application unit 203 (BP1), and a fourth memory element 223, which is coupled to a control input of second application unit 207 (BP2). Further, a first control terminal 225 and a second control terminal 227 are provided. First control terminal 225 is connected to a control input of first signal processing element 201, via a delay element 202 to a control input of first memory element 217, and to a control input of third memory element 221. Second control terminal 227 is connected to a control input of second signal processing element 205, via a delay element 204 to a control input of second memory element 219, and to a control input of fourth memory element 223.

First signal processing element 201 and second signal processing element 205 are filters with settable coefficients, which enables flexible adjustment of the filter characteristic. The exchange of the coefficients of the respective filter can be initiated, for example, by control signals $S_{BW1}$, $S_{BW2}$ that can be applied at control terminals 225 or 227. The coefficients corresponding to the contents of the respective control signals $S_{BW1}$, $S_{BW2}$ are set in the respective filter 201, 205 in response to an appropriate control signal $S_{BW1}$, $S_{BW2}$, which in each case preferably determines the filter bandwidth. For this purpose, for example, filter 201 and/or filter 205 can have a memory in which several coefficient sets are stored.

The control signals $S_{BW1}$, $S_{BW2}$ can also be applied at memory elements 217, 219, 221, and 223 which in response hereto select the factors corresponding to the respective filter characteristic defined by the coefficients. Memory elements 221 and 223 select the respective application values and supply these to the particular application device 203 or 207. Application devices 203 or 207 can be, for example, amplifying or attenuating elements, which amplify the particular signal, for example, according to $1/(2^N)$, whereby N can be a positive or negative, preferably natural number. For example, application devices 203 or 207 are configured as multiplication units. Each multiplication unit 203 or 207 can be configured as a multiplier. Each multiplication unit 203 or 207, however, is preferably configured as a shift register or multiplexer or gate logic. Configuration as a shift register or multiplexer or gate logic enables a simple shifting of the input bit values or their significance. This is especially simple to realize.

To control the application device 203 or 207, memory elements 221 and 223 in this case select as the application values n, n1, n2 the aforementioned power of two, which can be different in each case. Memory elements 221 and 223, however, can select only the (positive and negative) whole numbers N, which can be different in each case and provide these to the respective application device 203 or 207 for amplification or attenuation.

The control signals $S_{BW1}$, $S_{BW2}$ are relayed further to memory elements 217 and 219, e.g., in each case suitably delayed by delay element 202 or 204, which in response hereto select the corresponding correction values (residual1, residual2) depending on a residual error, which can be different for adders 213 and 215 and remains from the amplification or attenuation of filter 201 or 205 and application device 203 or 207. Memory elements 217 and 219 provide the respective correction values to the respective adder 213 or 215. Adders 213 and 215 sum the correction values, whereby a total correction value is superimposed on the detection value by adder 211 as a component of a correction device. The correction values can be, for example, base Id2 logarithmic numbers. The particular correction values and the particular application values form, for example, in each case a predefined factor pair, assigned to the particular characteristic of filter 201 or 205.

Detection unit 209 performs, for example, an RSSI measurement, whereby the detection value $RSSI_R$ corresponds to a rough RSSI measured (partial) value and can also be a base Id2 logarithmic number. Adder 211 performs the addition of the detection value $RSSI_R$ with a partial value $RSSI_C$ determined by the correction and outputs a corrected detection value, in the exemplary embodiment of FIG. 2 an RSSI measured value.

The first control signal $S_{BW1}$, which can be applied at first control terminal 225, can be supplied to memory element 217 via a delay element 202, which produces a delay $\Delta 1$ that corresponds to the delay $\Delta 1$ produced by elements 201, 203, 205, 207, and 209. The second control signal $S_{BW2}$, which can be applied at second control terminal 227, can be supplied to memory element 219 via a delay element 204, which produces a delay $\Delta 2$ that corresponds to the delay $\Delta 2$ produced by elements 205, 207, and 209.

To generate the control signals $S_{BW1}$, $S_{BW2}$ that can be applied at control terminals 225 or 227, further a control device (103 in FIG. 1 but not shown in FIG. 2) can be provided.

A signal received over an antenna 299 is supplied to the respective filters 201 and 205, for example, after amplification by an amplifier 298, e.g., an LNA (Low Noise Amplifier) and an analog-to-digital conversion by the analog-to-digital converter 297. The amplification or attenuation by filter 201 or 205 is roughly corrected by an amplification or attenuation by the application device 203 or 207 at the output of the respective filter 201 or 205, so that the error that arises in following RSSI measurement and is brought about by the respective filter amplification or filter attenuation is roughly compensated.

The measured value after the rough compensation is burdened with a (residual) error, however, which can be further reduced with use of correction unit 211. For this purpose, a correction value residual1 or residual2, corresponding to the residual error, is output from memory 217 or 219. The assignment of the correction value residual1 or residual2 for attenuation/amplification of filter 201 or 205 and for attenuation/amplification of application device 203 or 207 is effected by the predefined stored values (Table T1 or T2) and the control signal $S_{BW1}$ or $S_{BW2}$ selecting the transfer characteristic of filter 201 or 207 and the stored values (Tables T1 and T1 (Id) or T2 and T2(Id). In this case, the control signal $S_{BW1}$ or $S_{BW2}$ controls table values T1 and T1 (Id), corresponding to the filter coefficients, for the application device 203 or 207 and corresponding table values T2 and T2(Id) corresponding to the residual error (residual1, residual2) for correction unit 211.

In this way, as many filter stages 201, 205 as desired can be used whose characteristics can be selectively compensated individually with consideration of the application and correction values.

Figure 3:
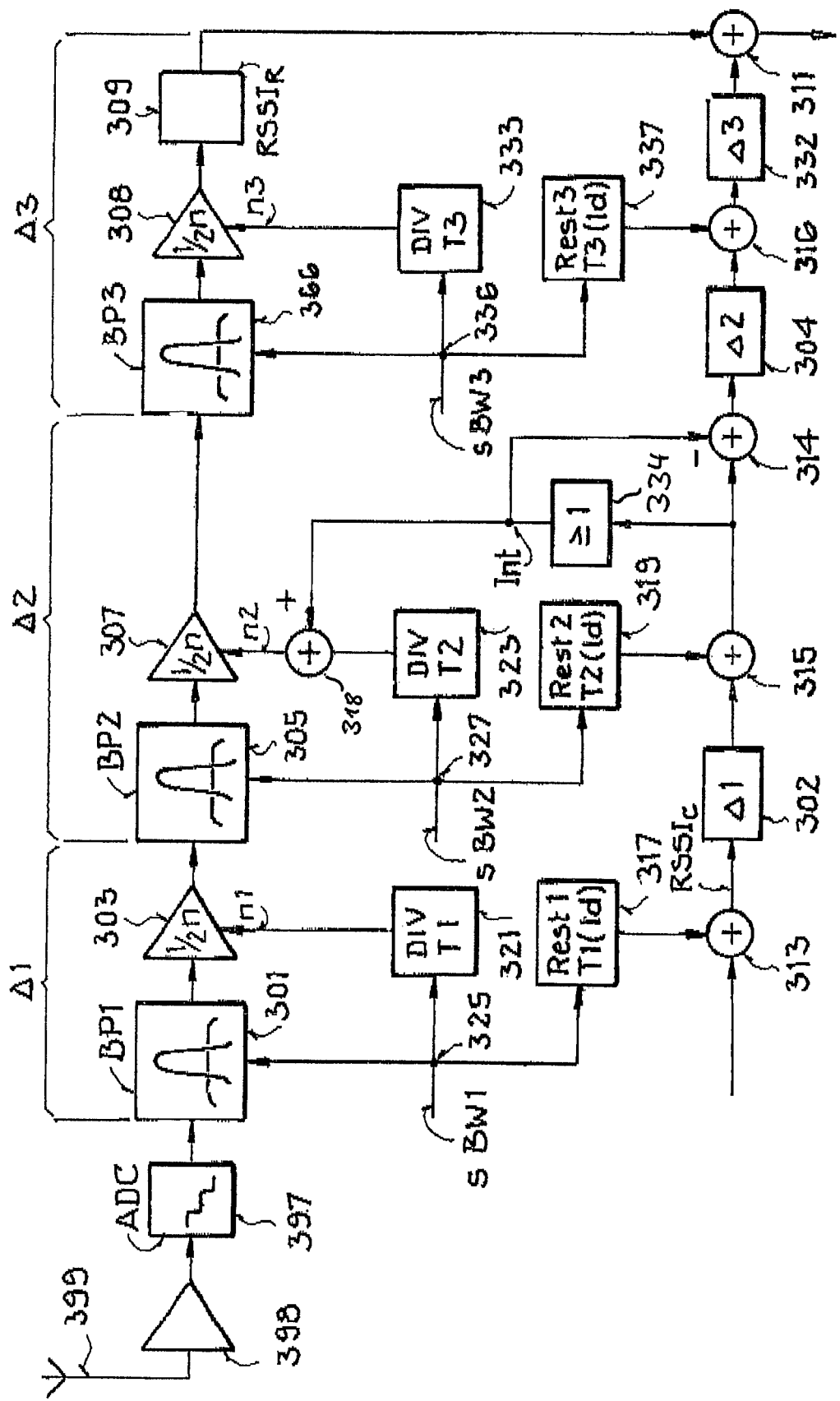
FIG. 3 illustrates another exemplary embodiment of a signal processing device in the form of a block diagram.

FIG. 3 shows another exemplary embodiment of a signal processing device in the form of a block diagram. The signal processing device is, for example, part of a receiver. A received signal reaches a detection unit 309 via an antenna 399, an analog amplifier 398, and an analog-to-digital converter 397 as a digitized signal; the detection unit has upstream-connected three settable bandpass filters 301, 305, 366 each with a multiplication unit 303, 307, 308 in the signal path.

Detection unit 309 is configured to detect a signal strength of the signal filtered through bandpass filters 301, 305, 366. Detection unit 309 is configured to output a detection value $RSSI_R$, which represents the signal strength of the filtered signal.

Digital filters 301, 305, 366 are configured settable, whereby filter coefficients for setting a transfer characteristic of the respective filter 301, 305, 366 are assigned to an amplification or attenuation of the signal by filter 301, 305, 366. An amplification or attenuation can usually not be avoided to achieve a bandpass transfer function. With a change in the transfer function, for example, by changing the bandwidth of the respective filter 301, 305, 366, the amplification or attenuation of the signal in the passband is also changed of necessity but in a predefined way.

Multiplication units are provided to compensate for this amplification or attenuation of the signal by the respective filter 301, 305, 366 as simply as possible. If, for example, the attenuation by the filter is 1/4.2, compensation by the factor of 4 can occur by the multiplication unit, so that the total attenuation from the filter and multiplication unit is 4/4.2. Because the total attenuation is not equal to 1, the attenuation of the filter is only partially compensated and a residual error remains.

Multiplication units 303, 307, 308 enable only an amplification or attenuation by the factor $1/(2^n)$, where n is a whole number. The inputs of multiplication units 303, 307, 308 are therefore controlled exclusively by signals n1, n2, n3 for whole numbers. It is possible thereby to configure multiplication units 303, 307, 308 as simple shift registers or as simple multiplexers or as simple gate logics, which shift the bits of the signal upwards with respect to their significance according to the amplification and downwards with respect to their significance according to the attenuation.

For a coordinated setting of the filter coefficients and the amplification or attenuation by the respective multiplication unit 303, 307, 308, in each case a control signal $S_{BW1}$, $S_{BW2}$, $S_{BW3}$ can be applied at a control terminal 325, 327, or 336. Control signal $S_{BW1}$ causes a reading of the stored values n1, assigned to the filter coefficients, in Table T1 of memory element 321. At the same time, control signal $S_{BW1}$ causes a reading of correction values residuals from a table T1(Id). Memory elements 321 and 317 here can be an individual memory or fixed or freely definable areas in a total memory (flash, etc.).

The signal processing device has a correction unit to apply to the detection value a correction value at least partially compensating for the residual error. The correction unit in the exemplary embodiment of FIG. 3 has an adder 311 for the addition of logarithmic values. In this case, the detection value $RSSI_R$ of detection unit 309 is also logarithmic. The correction value residual1 of Table T1 (Id) is also logarithmic and reaches adder 311 of the correction unit via adder 313, delay element 302 with delay $\Delta 1$, adders 315 and 314, delay element 304 with delay $\Delta 2$, adder 316, and delay element 332 with delay $\Delta 3$.

The same applies to memory elements 319, 323, 333, and 337 with the Tables T2, T2 (Id) for the correction value residual2 and with the Tables T3 and T3(Id) with the correction value residual3. Here, these correction values residual2 and residual3 also reach adder 311 of the correction unit. In so doing, it is possible that the sum of the correction values residual1 and residual2 reach or exceed the number 1. A comparator 334 is provided for this purpose, which compares the sum with the number 1. If the sum reaches or exceeds the number 1, a whole number (integer value) Int is summed by adder 318 and increases accordingly the factor n2 of multiplication unit 307. Accordingly, the same whole number Int is supplied as a negative value to adder 314 and thereby again subtracted from the sum of the correction values residual1 and residual2. This leads to the surprising effect that both the bit width and thereby the chip area of filters 305, 366 and multiplication units 307, 308, as well as that of delay members 304, 332 and adders 314, 316, 311 can be minimized without reducing the resolution.

The setting of the coefficients of filters 301, 305, 366 occurs preferably in a timed manner and/or as a function of a measured frequency offset of the signal from an expected center frequency, whereby to this end the bandwidth of the respective filter 301, 305, 366 is reduced.

The invention is not limited thereby to the shown exemplary embodiments in FIGS. 1 through 3. For example, it is possible to provide a greater number of filter steps.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A signal processing device comprising:
   a filter functioning as a signal processing element having settable filter coefficients for a predefined transfer characteristic;
   an application unit for amplifying or attenuating an output signal of the filter, the application unit configured to compensate partially for an effect of the predefined transfer characteristic of the filter based on a characteristic quantity of an input signal, the compensation being encumbered with a residual error;
   a detection unit for detecting a characteristic quantity representing the characteristic quantity of the input signal of an output signal of the signal processing element, the detection unit configured to output a detection value that represents the characteristic quantity of the output signal;

a correction unit for applying a predefined correction value to the detection value for the at least partial compensation of the residual error, the predefined correction value being assigned to the predefined transfer characteristic; and a control unit for setting the predefined filter coefficients of the filter, the predefined amplification or attenuation of the application unit, and the predefined correction value of the correction unit, wherein the control unit is configured to select the predefined transfer characteristic from a plurality of transfer characteristics, wherein each transfer characteristic of the plurality of transfer characteristics is assigned a correction value.

2. The signal processing device according to claim 1, wherein the characteristic quantity is the power or the energy or the amplitude or the phase.

3. The signal processing device according to claim 1, wherein the detection unit is configured to measure the characteristic quantity of the output signal.

4. The signal processing device according to claim 1, wherein the predefined transfer characteristic is a predefined transfer function or a predefined impulse response or a predefined attenuation characteristic or a predefined amplification.

5. The signal processing device according to claim 1, wherein each transfer characteristic is assigned an application value.

6. The signal processing device according to claim 5, wherein each transfer characteristic of the plurality of transfer characteristics is assigned an application value of the application unit.

7. The signal processing device according to claim 5, wherein the application value is a power of two.

8. The signal processing device according to claim 1, wherein the control unit is configured to provide the predefined correction value to the correction unit.

9. The signal processing device according to claim 1, wherein the correction unit is configured to apply the correction value to the detection value by addition or multiplication.

10. A signal processing method comprising:
    selecting a predefined transfer characteristic from a plurality of transfer characteristics, wherein each transfer characteristic of the plurality of transfer characteristics is assigned a correction value;
    processing a signal via a filter as a signal processing element, the filter having settable filter coefficients for the predefined transfer characteristic to obtain an output signal;
    setting the filter coefficients of the filter;
    amplifying or attenuating the output signal by an application unit that is configured to compensate partially for an effect of the predefined transfer characteristic of the filter based on a characteristic quantity of an input signal, the compensation being encumbered with a residual error;
    detecting a characteristic quantity representing the characteristic quantity of the input signal of an output signal of the signal processing element;
    outputting a detection value, which represents the characteristic quantity of the output signal; and
    applying a predefined correction value to the detection value for the at least partial compensation of the residual error, the correction value being assigned the predefined transfer characteristic.

11. The method according to claim 10, wherein the characteristic quantity is the power or the energy or the amplitude or the phase.

12. The method according to claim 10, comprising measuring the characteristic quantity of the output signal.

13. The method according to claim 10, wherein the predefined transfer characteristic is a predefined transfer function or a predefined impulse response or a predefined attenuation characteristic or a predefined amplification.

14. The method according to claim 10, wherein each transfer characteristic is assigned an application value.

15. The method according to claim 10, comprising providing the predefined correction value to the correction unit.

16. The method according to claim 14, wherein each transfer characteristic of the plurality of transfer characteristics is assigned an application value of the application unit.

17. The method according to claim 14, wherein the application value is a power of two.

18. The method according to claim 10, comprising applying the correction value to the detection value by addition or multiplication.

19. A non-transitory computer-readable medium comprising logic, the logic when executed by a processor operable to perform operations comprising:
    selecting a predefined transfer characteristic from a plurality of transfer characteristics, wherein each transfer characteristic of the plurality of transfer characteristics is assigned a correction value;
    processing a signal via a filter as a signal processing element, the filter having settable filter coefficients for the predefined transfer characteristic to obtain an output signal;
    setting the filter coefficients of the filter;
    amplifying or attenuating the output signal by an application unit that is configured to compensate partially for an effect of the predefined transfer characteristic of the filter based on a characteristic quantity of an input signal, the compensation being encumbered with a residual error;
    detecting a characteristic quantity representing the characteristic quantity of the input signal of an output signal of the signal processing element;
    outputting a detection value, which represents the characteristic quantity of the output signal; and
    applying a predefined correction value to the detection value for the at least partial compensation of the residual error, the correction value being assigned the predefined transfer characteristic.

20. The non-transitory computer-readable medium according to claim 19, wherein each transfer characteristic is assigned an application value.

* * * * *